United States Patent [19]
Childers

[11] Patent Number: 5,471,163
[45] Date of Patent: Nov. 28, 1995

[54] TAB CIRCUIT FUSIBLE LINKS FOR DISCONNECTION OR ENCODING INFORMATION

[75] Inventor: Winthrop D. Childers, San Diego, Calif.

[73] Assignee: Hewlett-Packard Company, Palo Alto, Calif.

[21] Appl. No.: 153,728

[22] Filed: Nov. 16, 1993

[51] Int. Cl.$^6$ .................................................. H01H 37/76
[52] U.S. Cl. ............................ 327/525; 361/749; 347/50; 347/57
[58] Field of Search ......................... 307/202.1; 361/749, 361/765, 767, 633; 347/50, 57, 58; 327/525

[56] References Cited

U.S. PATENT DOCUMENTS

| | | | |
|---|---|---|---|
| 3,967,161 | 6/1976 | Lichtblau | 361/765 |
| 4,706,059 | 11/1987 | Schmitt | 337/297 |
| 4,742,431 | 5/1988 | Igarashi | 361/749 |
| 4,806,106 | 2/1989 | Mebane et al. | 347/50 |
| 4,878,070 | 10/1989 | Watrobski | 361/749 |
| 4,918,385 | 4/1990 | Shreeve | 371/22.6 |
| 5,059,950 | 10/1991 | Perchak | 340/572 |
| 5,099,219 | 3/1992 | Roberts | 337/297 |

FOREIGN PATENT DOCUMENTS

| | | |
|---|---|---|
| 0412459 | 8/1990 | European Pat. Off. . |
| WO9000971 | 2/1990 | Germany . |

*Primary Examiner*—Edward P. Westin
*Assistant Examiner*—Jon Santamauro

[57] ABSTRACT

A flexible lead frame type tab circuit including a flexible dielectric substrate, a plurality of conductive elements disposed on the dielectric substrate, and fusible links connected between selected conductive elements to enable selective electrical isolation between conductive elements and to enable encoding of machine readable information on the flexible tab circuit.

12 Claims, 2 Drawing Sheets

TAB CIRCUIT FUSIBLE LINKS FOR DISCONNECTION OR ENCODING INFORMATION

BACKGROUND OF THE INVENTION

The subject invention is generally directed to thermal ink jet printers, and more particularly to tab circuit fusible links that enable selective electrical isolation and encoding of information on a tab circuit for a thermal ink jet printhead cartridge.

An ink jet printer forms a printed image by printing a pattern of individual dots at particular locations of an array defined for the printing medium. The locations are conveniently visualized as being small dots in a rectilinear array. The locations are sometimes "dot locations", "dot positions", or "pixels". Thus, the printing operation can be viewed as the filling of a pattern of dot locations with dots of ink.

Ink jet printers print dots by ejecting very small drops of ink onto the print medium, and typically include a movable carriage that supports one or more printheads each having ink ejecting nozzles. The carriage traverses over the surface of the print medium, and the nozzles are controlled to eject drops of ink at appropriate times pursuant to command of a microcomputer or other controller, wherein the timing of the application of the ink drops is intended to correspond to the pattern of pixels of the image being printed.

The printheads of thermal ink jet printers are commonly implemented as replaceable printhead cartridges which typically include one or more ink reservoirs and an integrated circuit printhead that includes a nozzle plate having an array of ink ejecting nozzles, a plurality of ink firing chambers adjacent respective nozzles, and a plurality of heater resistors adjacent the firing chambers opposite the ink ejecting nozzles and spaced therefrom by the firing chambers. Each heater resistor causes an ink drop to be fired from its associated nozzle in response to an electrical pulse of sufficient energy.

A thermal ink jet printhead requires a certain minimum energy to fire ink drops of the proper volume (herein called the turn on energy). Turn on energy can be different for different printhead designs, and in fact varies among different samples of a given printhead design as a result of manufacturing tolerances. As a result, thermal ink jet printers are configured to provide a fixed ink firing energy that is greater than the expected lowest turn on energy for the printhead cartridges it can accommodate.

A consideration with utilizing a fixed ink firing energy is that firing energies excessively greater than the actual turn on energy of a particular printhead cartridge result in a shorter operating lifetime for the heater resistors and degraded print quality. Another consideration with utilizing a fixed ink firing energy is the inability to utilize newly developed or revised printheads that have ink firing energy requirements that are different from those for which existing thermal ink jet printers have been configured.

SUMMARY OF THE INVENTION

It would therefore be an advantage to provide a means by which thermal ink jet printhead cartridges can be encoded with machine readable information such as operating energy, so as to permit a printer in which a thermal ink jet print head is installed to read encoded information.

The foregoing and other advantages are provided by the invention in a flexible lead frame type tab circuit that includes a flexible dielectric substrate, a plurality of conductive elements disposed on the dielectric substrate, and at least one fusible link connected between selected conductive elements to enable selective electrical isolation between conductive elements and to enable encoding of machine readable information on the flexible tab circuit.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION OF THE DISCLOSURE

Figure 1:
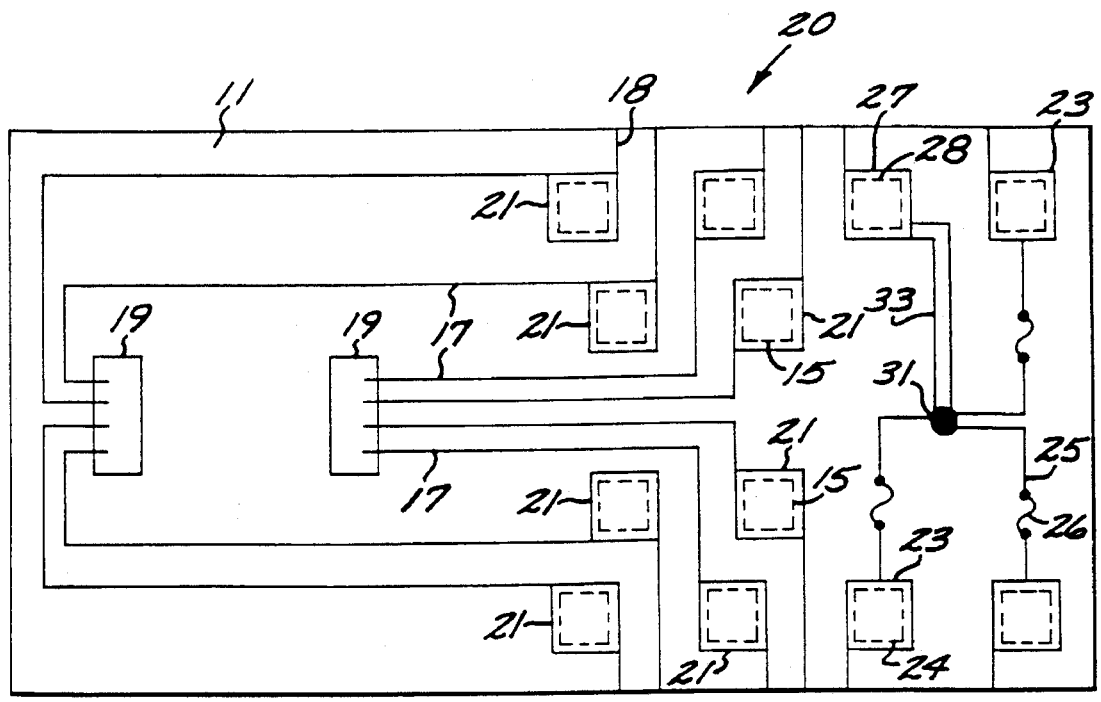
FIG. 1 sets forth a simplified schematic illustration of a flexible interconnect circuit that includes fusible links in accordance with the invention for encoding machine readable information.

In the following detailed description and in the several figures of the drawing, like elements are identified with like reference numerals.

The disclosed invention is generally directed to flexible "tab" circuits such as those installed on a thermal ink jet printhead cartridge for enabling electrical connection of the printhead to the printer in which the printhead cartridge is installed. A flexible tab circuit is a lead frame type of flexible or "flex" circuit that typically comprises a flexible planar substrate or film and a metallization pattern that is supported by one side the flexible substrate. The metallization pattern is formed by various techniques, including, for example, photolithographic formation of a copper metallization pattern followed by electrochemical plating of gold on the copper metallization. In accordance with the invention, fusible links are formed in the metallization pattern for various uses, including for example encoding information on the flexible tab circuit and electrical isolation of metallization.

Referring now to FIG. 1, set forth therein is a simplified schematic illustration of a flexible circuit 20 which contains fusible links in accordance with the invention to enable information to be encoded on the flexible tab circuit 20. The flexible circuit 20 includes a flexible substrate 11 and a metallization pattern supported on one side of the flexible substrate, and FIG. 1 depicts the side of the flexible circuit that includes the metallization pattern. The side of the flexible tab circuit that contains the metallization is called the metallization side or the back side of the flexible circuit, while the other side of the flexible tab circuit is called the front side. When installed on a printhead cartridge, the metallization side of the flexible tab circuit is against the print cartridge and external electrical contact with the portions of the metallization pattern is made through openings in the substrate.

The metallization pattern of the flexible circuit of FIG. 1 includes elongated conductive traces 17 that extend between (a) bonding window openings 19 in the substrate where the ends of the conductive traces 17 are appropriately bonded to an integrated circuit printhead (not shown) when installed on a thermal ink jet printhead cartridge and (b) respective interconnect pads 21 which are exposed on the front side of the tab circuit 20 by the openings 15 in the substrate 11 that are represented by broken line rectangles within the perimeter of the pads 21.

The metallization pattern of the flexible circuit of FIG. 1 further includes a conductive encoding common pad 27 which is exposed on the front side of the tab circuit 20 by an opening 28 in the substrate 11 that is represented by a broken line rectangle within the perimeter of the encoding pad 27, and a plurality of conductive encoding pads 23 which are exposed on the front side of the tab circuit 20 by the openings 24 in the substrate 11 that are represented by broken line rectangles within the perimeter of the encoding pads 23. The encoding pads 23 are respectively connected by conductive encoding traces 25 to a connection pad 31 that is at one end of a wide metallization trace 33 whose other end is connected to the encoding common pad 27. In accordance with the invention, each encoding conductive trace 25 includes a fusible link 26, and information is encoded in the tab circuit by burning selected fusible links to produce a pattern of burned fusible links. For example, the pattern of burned links can be used to encode the operating energy for the printhead cartridge on which the flexible tab circuit is installed, and the printer in which the printhead cartridge is installed would read the encoded information to set the operating energy delivered to the printhead cartridge. The encoded pattern of burned fusible links is formed by applying an appropriate current pulse between selected encoding pads 23 and the common conductive pad 27, for example during manufacturing, and the pattern of burned fusible links is detected by checking the continuity between each of the conductive encoding pads 23 and the common conductive pad 27.

It should be appreciated that the wide conductive trace 31 will typically be wider than the conductive traces 25 to allow for concurrently burning a plurality of fusible links without damaging the wide conductive trace.

For completeness, FIG. 1 shows short conductive traces 18 extending between the edge of the substrate 11 and respective interconnect pads 21 and encoding pads 23. Such traces 18 are remaining portions of a metallization structure used for electroplating the metallization pattern of the flexible tab circuit. In particular, flexible tab circuit of FIG. 1 is formed from a larger substrate on which is disposed a buss bar that is formed as part of the metallization pattern of the tab circuit. The short conductive traces 18 electrically connect the interconnect pads, the encoding pads, and the conductive traces to the buss bar which in turn is connected to the electroplating system. After electroplating, the buss bar is removed and the interconnect pads are electrically isolated by removing the portion of the larger substrate that contained the buss bar, for example by die punching.

Figure 2:
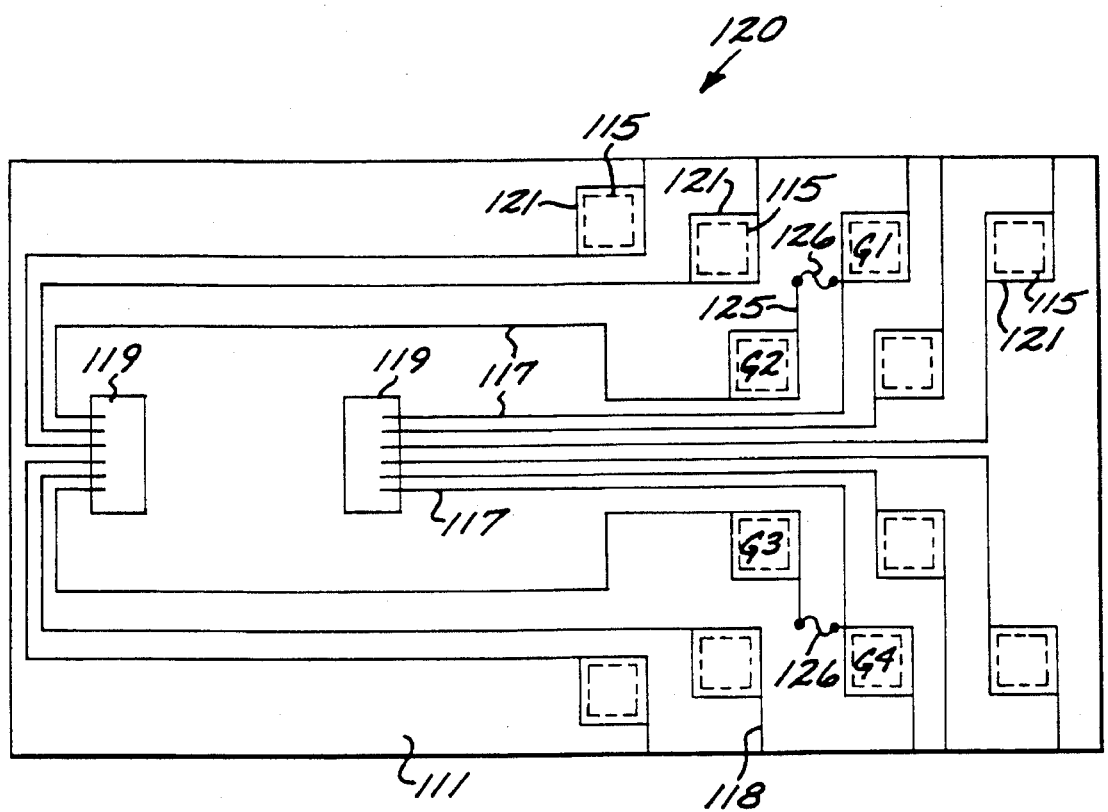
FIG. 2 sets forth a simplified schematic illustration of a flexible interconnect circuit that includes fusible links in accordance with the invention for encoding machine readable information using interconnect pads of the flexible interconnect circuit.

Referring now to FIG. 2, set forth therein is a simplified schematic illustration of another flexible circuit 120 which contains fusible links in accordance with the invention to enable information to be encoded on the flexible tab circuit 120. The flexible circuit 120 includes a flexible substrate 111 and a metallization pattern supported on one side of the flexible substrate, and FIG. 2 depicts the side of the flexible circuit that includes the metallization pattern. As with the flexible circuit of FIG. 1, the side of the flexible tab circuit of FIG. 2 that contains the metallization is called the metallization side or the back side of the flexible circuit, while the other side of the flexible tab circuit is called the front side. When installed on a printhead cartridge, the metallization side of the flexible tab circuit is against the print cartridge and external electrical contact with the portions of the metallization pattern is made through openings in the substrate.

The metallization pattern of the flexible circuit of FIG. 2 includes elongated conductive traces 117 that extend between (a) bonding window openings 119 in the substrate where the ends of the conductive traces 117 are appropriately bonded to an integrated circuit printhead (not shown) when installed on a thermal ink jet printhead cartridge and (b) respective interconnect pads 121 which are exposed on the front side of the tab circuit 120 by the openings 115 in the substrate 111 that are represented by broken line rectangles within the perimeter of the pads 121. Four of the interconnect pads, identified by the references G1, G2, G3, G4 are ground pads that are intended to be connected to a common ground reference in the integrated circuit printhead with which the flexible circuit is to be utilized. In accordance with the invention, the ground pads G1, G2 are connected by a conductive trace 125 that includes a fusible link 126 formed therein. Similarly, the ground pads G3, G4 are connected by a conductive trace 125 that includes a fusible link 126 formed therein.

Each of the interconnect pads 121, except for the ground pads G2, G3 includes a short conductive trace 118 that extends from the interconnect pad to the edge of the substrate. Such traces 118 are remaining portions of a metallization structure used for electroplating the metallization pattern of the flexible tab circuit. In particular, the flexible tab circuit of FIG. 2 is formed from a larger substrate on which is disposed a buss bar that is formed as part of the metallization pattern of the tab circuit. The short conductive traces 118 electrically connect the interconnect pads and the conductive traces to the buss bar which in turn is connected to the electroplating system. After electroplating, the buss bar is removed and the interconnect pads are electrically isolated by removing the portion of the larger substrate that contained the buss bar, for example by die punching. It should be appreciated that the ground pads G2, G3 did not need to be connected to the buss bar by their own metallization traces since they are electrically connected via the fused conductive traces 125 to the ground pads G1, G4 which were connected to the buss bar by conductive traces 118.

Information is encoded in the tab circuit of FIG. 2 by burning selected fusible links to produce a pattern of burned fusible links. For example, the pattern of burned links can be used to encode the operating energy for the printhead cartridge on which the flexible tab circuit is installed, and the printer in which the printhead cartridge is installed would read the encoded information to set the operating energy delivered to the printhead cartridge. The encoded pattern of burned fusible links is formed by applying an appropriate current pulse between selected fusibly linked ground pad pairs, and the pattern of burned fusible links is detected by checking the continuity between the ground pads of each ground pad pair, for example, by causing the integrated circuit printhead to electrically isolate each ground pad pair from the ground reference potential and then checking whether the pads of each ground pad pair are connected to each other.

Figure 3:
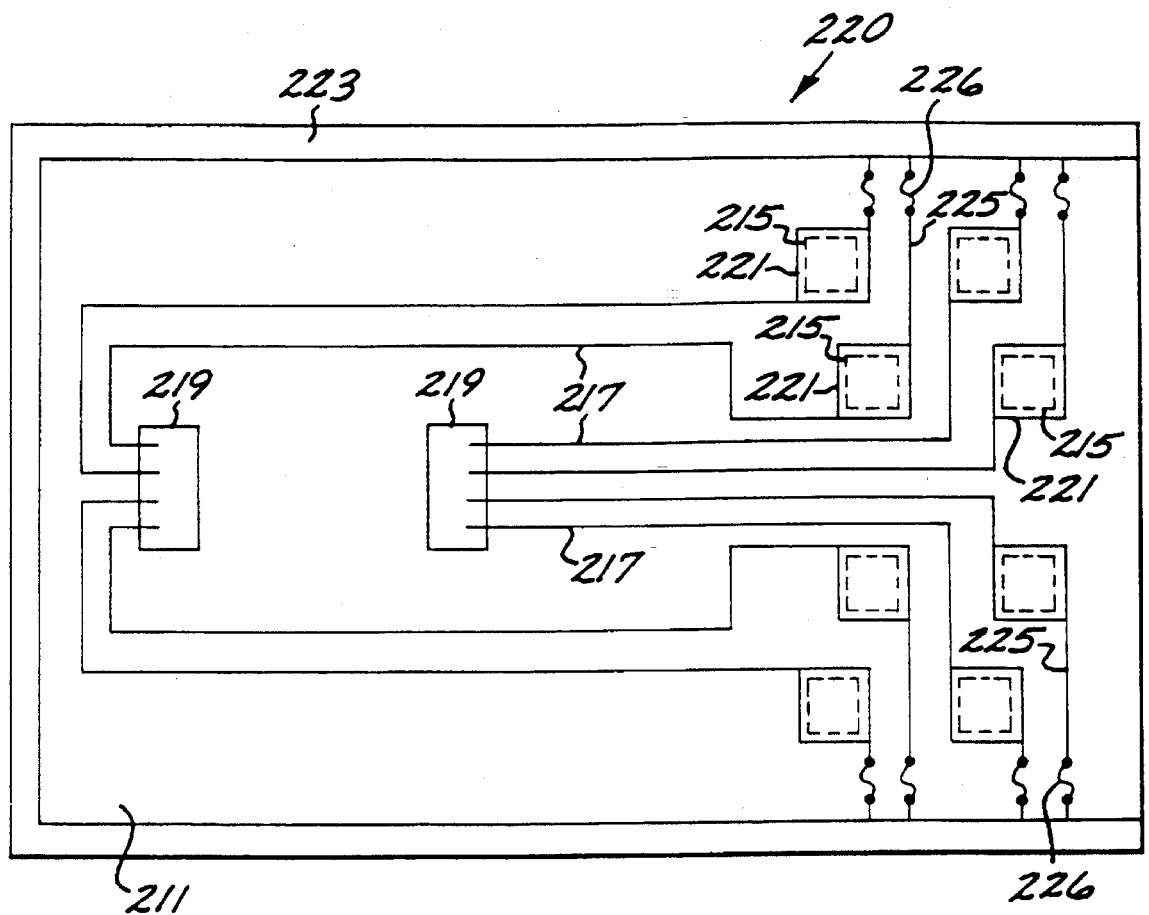
FIG. 3 sets forth a simplified schematic illustration of a flexible interconnect circuit that includes fusible links in accordance with the invention for enabling electrical isolation between conductive elements of the flexible interconnect circuit.

Referring now to FIG. 3, set forth therein is a simplified schematic illustration of a flexible circuit 220 which contains fusible links to enable isolation of conductive traces of the flexible tab circuit 220 after plating of the metallization pattern of the flexible circuit. The flexible circuit 220 includes a flexible substrate 211 and a metallization pattern supported on one side of the flexible substrate, and FIG. 3 depicts the side of the flexible circuit that includes the metallization pattern. As with the flexible circuit of FIG. 1, the side of the flexible tab circuit of FIG. 3 that contains the metallization is called the metallization side or the back side of the flexible circuit, while the other side of the flexible tab circuit is called the front side. When installed on a printhead cartridge, the metallization side of the flexible tab circuit is against the print cartridge and external electrical contact with the portions of the metallization pattern is made through openings in the substrate.

The metallization pattern of the flexible circuit of FIG. 3 includes elongated conductive traces 217 that extend between (a) bonding window openings 219 in the substrate where the ends of the conductive traces 217 are appropriately bonded to an integrated circuit printhead (not shown) when installed on a thermal ink jet printhead cartridge and (b) respective interconnect pads 221 which are exposed on the front side of the tab circuit 220 by the openings 215 in the substrate 211 that are represented by broken line rectangles within the perimeter of the pads 221.

The flexible tab circuit of FIG. 3 further includes a main ground metallization trace or buss bar metallization trace 223 that is adjacent the periphery of the flexible tab circuit. In the flexible tab circuit of FIG. 3 the main ground metallization functions as the buss bar when the tab circuit is metallized prior to its removal from a larger substrate on which the tab circuit conventionally formed. Since the ground metallization trace has functionality as part of the flexible tab circuit, it is retained as part of the tab circuit, unlike other implementations wherein the bus bar is not maintained as part of the flexible tab circuit in its ultimate configuration. Each of the interconnect pads 221 is connected to the main ground metallization trace 223 by conductive traces 225 that respectively include fusible links 226. The fusible links 226 are utilized for electroplating the metallization pattern of the flexible tab circuit. In particular, the fusible links 226 function to electrically connect the interconnect pads 221 and the elongated traces 217 to the main ground metallization trace 223 which in turn was electrically connected to the electroplating system. After electroplating, the interconnect pads 221 and elongated traces 217 are electrically isolated from the main ground metallization trace by applying an appropriate current pulse between each of the interconnect pads 221 and the main ground metallization trace 223. It should be appreciated that since the burned traces of the fuses are on the metallization side of the flexible tab circuit, the possibility of ink reaching and shorting the burned fuse traces is very small.

Figure 4:
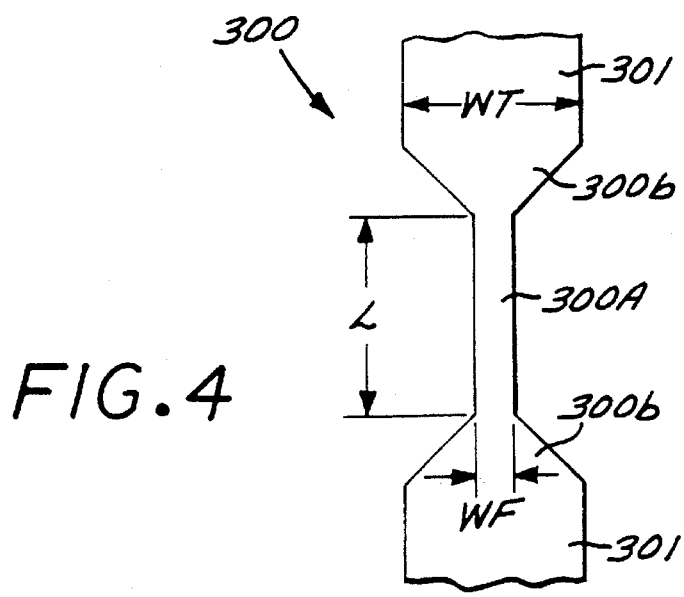
FIG. 4 sets forth a simplified schematic illustration of an implementation of a fusible link structure for use in the flexible interconnect circuits of FIGS. 1, 2, and 3.

Referring now to FIG. 4, schematically depicted therein by way of illustrative example is a fusible link structure 300 that can be implemented as each of the fusible links in the flexible tab circuits of FIGS. 1–3. The fusible link structure 300 comprises a component that is formed in the metallization pattern of a flexible tab circuit and includes a central fuse 300a having a width WF which is narrower that the width WT of the conductive trace 301 in which the fusible link is formed, and a length L. The fusible link structure further includes tapered traces 300b that provide a transition in metallization width between the conductive trace 301 and the fuse 300.

Preferably, the ratio WF/WT between the width of the fuse 300a and the width of the conductive trace 301 is maximized to assured that the traces to the fuse are not damaged, within space constraints and the resolution and process limits of the particular process utilized to produce the flexible tab circuit. Widening of a trace may be limited by circuit layout constraints, while narrowing of a fuse may limited by particular manufacturing capabilities. As to the length of the fuse, a longer fuse will burn more reliably, but there may be practical limits to fuse length. Typically, the length of a fuse can be between one and 10 times its width, with a likely length of about two to three times width. It is noted that including a bend in the fuse may help it burn more reliably.

By way of a particular illustrative example, typical dimensions of a fuse connected to conductive traces having a width of 0.004 inches would include a fuse width of about 0.002 inches and a fuse length of about 0.004 inches.

As to the current required to burn a fuse, the exact profile of an appropriate current pulse can, for example, be determined empirically for a particular fuse design.

The foregoing has been a disclosure of a tab circuit structure that provides for encoding of machine readable information on a circuit that is conventionally attached to thermal ink jet printheads for electrical connection between printheads and the printers in which they are installed, and which advantageously facilitates electrical isolation of conductive traces in the tab circuit that otherwise would be difficult to isolate by conventional procedures such as die punching or cutting.

Although the foregoing has been a description and illustration of specific embodiments of the invention, various modifications and changes thereto can be made by persons skilled in the art without departing from the scope and spirit of the invention as defined by the following claims.

What is claimed is:

1. A flexible interconnect circuit comprising:

a flexible dielectric substrate having a metallized side and a non-metallized side;

a first conductive pad disposed on the metallized side of said dielectric substrate over a first opening in said dielectric substrate so as to be contacted from the non-metallized side of said dielectric substrate through said first opening;

a second conductive pad disposed on the metallized side of said dielectric substrate over a second opening in said dielectric substrate so as to be contacted from the non-metallized side of said dielectric substrate through said second opening; and an electrically conductive fusible link connected between said first conductive pad and said second conductive pad.

2. The flexible interconnect circuit of claim 1 wherein said first and second conductive pads comprise ground pads.

3. A flexible interconnect circuit comprising:

a flexible dielectric substrate having a metallized side and a non-metallized side;

a plurality of conductive encoding pads disposed on the metallized side of said dielectric substrate over respective openings in said dielectric substrate so as to be contacted from the non-metallized side of said dielectric substrate through said respective openings;

a conductive common pad disposed on the metallized side of said dielectric substrate over a corresponding opening in said dielectric substrate so as to be contacted from the non-metallized side of said dielectric substrate through said corresponding opening; and a plurality of electrically conductive fusible links respectively connected between said plurality of conductive encoding pads and said conductive common pad.

4. A flexible interconnect circuit comprising:

a flexible dielectric substrate having a metallized side and a non-metallized side;

a plurality of conductive interconnect pads disposed on the metallized side of said dielectric substrate over respective openings in said dielectric substrate so as to be contacted from the non-metallized side of said dielectric substrate through said respective openings;

a plurality of elongated conductive interconnect traces disposed on the metallized side of said dielectric substrate and respectively connected to said conductive interconnect pads; and an electrically conductive fusible link respectively connected between a first selected conductive interconnect pad and a second selected conductive interconnect pad such that said first and second selected interconnect pads are electrically connected by said electrically conductive fusible link.

5. A flexible interconnect circuit comprising:

a flexible dielectric substrate having a metallized side and a non-metallized side;

a plurality of conductive interconnect pads disposed on the metallized side of said dielectric substrate over respective openings in said dielectric substrate so as to be contacted from the non-metallized side of said dielectric substrate through said respective openings;

a plurality of elongated conductive interconnect traces disposed on the metallized side of said dielectric substrate and respectively connected to said conductive interconnect pads;

a conductive trace disposed on said dielectric substrate adjacent said interconnect pads; and a plurality of electrically conductive fusible links respectively connected between said plurality of conductive interconnect pads and said conductive trace.

6. The flexible interconnect circuit of claim 5 wherein said conductive trace comprises a main ground trace.

7. A flexible interconnect circuit comprising:

a flexible dielectric substrate having a metallized side and a non-metallized side;

a metallization pattern attached to said metallized side of said flexible dielectric substrate, said metallization pattern including:

(a) a first conductive pad disposed on the metallized side of said dielectric substrate over a first opening in said dielectric substrate so as to be contacted from the non-metallized side of said dielectric substrate through said first opening;

(b) a second conductive pad disposed on the metallized side of said dielectric substrate over a second opening in said dielectric substrate so as to be contacted from the non-metallized side of said dielectric substrate through said second opening; and (c) an electrically conductive fusible link connected between said first conductive pad and said second conductive pad.

8. The flexible interconnect circuit of claim 7 wherein said first and second conductive pads comprise ground pads.

9. A flexible interconnect circuit comprising:

a flexible dielectric substrate having a metallized side and a non-metallized side;

a metallization pattern attached to said metallized side of said flexible dielectric substrate, said metallization pattern including:

(a) a plurality of conductive encoding pads disposed on the metallized side of said dielectric substrate over respective openings in said dielectric substrate so as to be contacted from the non-metallized side of said dielectric substrate through said respective openings;

(b) a conductive common pad disposed on the metallized side of said dielectric substrate over a corresponding opening in said dielectric substrate so as to be contacted from the non-metallized side of said dielectric substrate through said corresponding opening; and (c) a plurality of electrically conductive fusible links respectively connected between said plurality of conductive encoding pads and said conductive common pad.

10. A flexible interconnect circuit comprising:

a flexible dielectric substrate having a metallized side and a non-metallized side;

a metallization pattern attached to said metallized side of said flexible dielectric substrate, said metallization pattern including:

(a) a plurality of conductive interconnect pads disposed on the metallized side of said dielectric substrate over respective openings in said dielectric substrate so as to be contacted from the non-metallized side of said dielectric substrate through said respective openings;

(b) a plurality of elongated conductive interconnect traces disposed on the metallized side of said dielectric substrate and respectively connected to said conductive interconnect pads; and (c) an electrically conductive fusible link respectively connected between a first selected conductive interconnect pad and a second selected conductive interconnect pad such that said first and second selected interconnect pads are electrically connected by said electrically conductive fusible link.

11. A flexible interconnect circuit comprising:

a flexible dielectric substrate having a metallized side and a non-metallized side;

a metallization pattern attached to said metallized side of said flexible dielectric substrate, said metallization pattern including:

(a) a plurality of conductive interconnect pads disposed on the metallized side of said dielectric substrate over respective openings in said dielectric substrate so as to be contacted from the non-metallized side of said dielectric substrate through said respective openings;

(b) a plurality of elongated conductive interconnect traces disposed on the metallized side of said dielectric substrate and respectively connected to said conductive interconnect pads;

(c) a conductive trace disposed on said dielectric substrate adjacent said interconnect pads; and (d) a plurality of electrically conductive fusible links respectively connected between said plurality of conductive interconnect pads and said conductive trace.

12. The flexible interconnect circuit of claim 11 wherein said conductive trace comprises a main ground trace.

* * * * *